US010347826B1

(12) United States Patent
Bhushan et al.

(10) Patent No.: US 10,347,826 B1
(45) Date of Patent: Jul. 9, 2019

(54) STT-MRAM FLIP-CHIP MAGNETIC SHIELDING AND METHOD FOR PRODUCING THE SAME

(71) Applicant: GLOBALFOUNDRIES Singapore Pte. Ltd., Singapore (SG)

(72) Inventors: Bharat Bhushan, Singapore (SG); Juan Boon Tan, Singapore (SG); Danny Pak-Chum Shum, Singapore (SG); Wanbing Yi, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/864,741

(22) Filed: Jan. 8, 2018

(51) Int. Cl.
*H01L 43/12* (2006.01)
*H01L 43/02* (2006.01)
*H01L 27/22* (2006.01)

(52) U.S. Cl.
CPC ............ *H01L 43/12* (2013.01); *H01L 27/222* (2013.01); *H01L 43/02* (2013.01)

(58) Field of Classification Search
CPC ... H01L 2224/73103; H01L 2224/0401; H01L 2224/11914
See application file for complete search history.

(56) References Cited

U.S. PATENT DOCUMENTS

| 6,559,521 | B2 | 5/2003 | Tuttle |
| 6,936,763 | B2 | 8/2005 | Rizzo et al. |
| 7,105,363 | B2 | 9/2006 | Durlam et al. |
| 7,183,617 | B2 | 2/2007 | Wang et al. |
| 7,598,596 | B2 | 10/2009 | Molla et al. |
| 2009/0184414 | A1 | 7/2009 | Park et al. |
| 2012/0193737 | A1 | 8/2012 | Pang et al. |

(Continued)

FOREIGN PATENT DOCUMENTS

| DE | 102004040503 A1 | 2/2006 |
| KR | 1020070077686 A | 7/2007 |

(Continued)

OTHER PUBLICATIONS

Office Action for the related German patent application No. 102018203380.3, dated Aug. 10, 2018, 14 pages.

(Continued)

*Primary Examiner* — Fernando L Toledo
*Assistant Examiner* — Valerie N Newton
(74) *Attorney, Agent, or Firm* — Ditthavong & Steiner, P. C.

(57) ABSTRACT

Methods of magnetically shielding a perpendicular STT-MRAM structure on all six sides within a flip-chip package and the resulting devices are provided. Embodiments include forming a passivation stack over an upper surface of a wafer and outer portions of an Al pad; forming a polymer layer over the passivation stack; forming a UBM layer over the Al pad, portions of the polymer layer and along sidewalls of the polymer layer; forming a T-shaped Cu pillar over the UBM layer; forming a µ-bump over the T-shaped Cu pillar; dicing the wafer into a plurality of dies; forming an epoxy layer over a bottom surface of each die; forming a magnetic shielding layer over the epoxy layer and along sidewalls of each die, the epoxy layer, the passivation stack and the polymer layer; and connecting the µ-bump to a package substrate with a BGA balls.

18 Claims, 16 Drawing Sheets

(56) References Cited

U.S. PATENT DOCUMENTS

| | | |
|---|---|---|
| 2014/0197505 A1 | 7/2014 | Zhou |
| 2014/0319522 A1* | 10/2014 | Daubenspeck ......... H01L 24/11 257/48 |
| 2016/0284981 A1 | 9/2016 | Bharat et al. |
| 2016/0359100 A1* | 12/2016 | Bhushan ................ H01L 43/02 |

FOREIGN PATENT DOCUMENTS

| | | |
|---|---|---|
| TW | 201715691 A | 5/2017 |
| TW | 201719837 A | 6/2017 |

OTHER PUBLICATIONS

Office Action for the related Taiwanese application No. 107105267, dated Feb. 26, 2019, 10 pages.

* cited by examiner

US 10,347,826 B1

STT-MRAM FLIP-CHIP MAGNETIC SHIELDING AND METHOD FOR PRODUCING THE SAME

TECHNICAL FIELD

The present disclosure relates to design and fabrication methods for semiconductor packages. The present disclosure is particularly applicable to spin-transfer torque (STT)-magnetic random access memory (MRAM) structures in integrated circuit (IC).

BACKGROUND

IC chips, such as, STT-MRAM chips, are typically encapsulated in protective packages to prevent interference or change of spin in a magnetic tunnel junction (MTJ) from stray or externally applied electromagnetic fields and to prevent damage during subsequent processing. STT-MRAM structures need to be shielded from all sides with a shielding structure for better protection, however, known shielding approaches, e.g., in a wire-bond packaging, result in lower magnetic immunity because the shielding structure is not formed in a closed loop, which is especially true for perpendicular STT-MRAM structures. Further, wider openings in the shielding structures results in lower magnetic shielding performance, e.g., inferior threshold for magnetic shielding.

Referring to FIG. 1, a cross-sectional view of a magnetic shielding in a wire-bond MRAM package, magnetic epoxy layers 101 and 103 are formed over and below a portion of the MRAM structure 105, and a protective shield layer 107 is formed over and under the epoxy layers 101 and 103, respectively. However, this design is problematic, as described above, because the protective shield layer 107 has a wide opening 109 that exposes the MRAM die 105 to interference from externally applied electromagnetic fields. Further, the wire-bond package is incapable of high density input/output (I/O) required in system on chip (SOCs).

A need therefore exists for methodology enabling magnetically shielding of a perpendicular STT-MRAM structure from all six sides in flip-chip package.

SUMMARY

An aspect of the present disclosure is a method of magnetically shielding a perpendicular STT-MRAM structure on all six sides within a flip-chip package.

Another aspect of the present disclosure is a device with a perpendicular STT-MRAM structure magnetically shielded on all six sides within a flip-chip package.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a passivation stack over an upper surface of a wafer and outer portions of an aluminum (Al) pad; forming a polymer layer over the passivation stack; forming an under bump metallization (UBM) layer over the Al pad, portions of the polymer layer and along sidewalls of the polymer layer; forming a T-shaped copper (Cu) pillar over the UBM layer; forming a μ-bump over the T-shaped Cu pillar; dicing the wafer into a plurality of dies; forming an epoxy layer over a bottom surface of each die; forming a magnetic shielding layer over the epoxy layer and along sidewalls of each die, the epoxy layer, the passivation stack and the polymer layer; and connecting the μ-bump to a package substrate with a ball grid array (BGA)-balls.

Aspects of the present disclosure include forming the passivation stack by: forming an oxide layer over the wafer and the Al pad; forming a nitride layer over the oxide layer; and forming a via through patterning the nitride layer and the oxide layer down to the Al pad. Further aspects include forming a second magnetic shielding layer over the passivation stack prior to forming the polymer layer; and forming the polymer layer over the second magnetic shielding layer and portions of the Al pad and along sidewalls of the second magnetic shielding layer and the passivation stack. Another aspect includes forming the UBM layer and the T-shaped Cu pillar by: forming a UBM layer over the polymer layer and the Al pad and along sidewalls of the polymer layer; forming a photoresist layer over the UBM layer on opposite sides of the Al pad; forming a Cu layer over the UBM layer and along sidewalls of the photoresist layer; stripping the photoresist layer; and removing exposed portions of the UBM layer down to the polymer layer. Additional aspects include connecting the μ-bump to a package substrate by: forming an under-fill layer between the polymer layer and the package substrate. Further aspects include forming the UBM layer along sidewalls of the passivation stack. Additional aspects include forming the μ-bump by: forming a metal layer over the T-shaped Cu pillar; and reflowing the metal layer at a temperature of 200° C. to 260° C. Further aspects include forming a silicon nitride (SiN) spacer over portions of the polymer layer along each sidewall of the UBM layer and the T-shaped Cu pillar prior to forming magnetic shielding layer; forming a second epoxy layer over the polymer layer and adjacent to each SiN spacer; and forming a second magnetic shielding layer over the second epoxy layer and along sidewalls of the second epoxy layer. Another aspect includes connecting the μ-bump to a package substrate by: forming an under-fill layer between the second magnetic shielding layer and the package substrate. Further aspects include patterning the magnetic shielding layer over the front surface of the wafer around a keep out zone (KOZ) for μ-bumps.

Aspects of the present disclosure include a device including: a package substrate with BGA-balls; a μ-bump connected to an upper surface of the package substrate; a Cu pillar over the μ-bump; a UBM layer on the Cu pillar; a polymer layer over portions of the UBM layer and on sidewalls of the UBM layer; a passivation stack over the polymer layer; an Al pad over portions of the passivation stack and the UBM layer; a wafer over the passivation stack and the Al pad; an epoxy layer over the wafer; and a magnetic shielding layer over the epoxy layer and along sidewalls of the epoxy layer, the wafer, the passivation stack and the polymer layer.

Aspects of the device include the passivation stack including: a nitride layer over the polymer layer; and an oxide layer over the nitride layer. Another aspect includes a second magnetic shielding layer over the polymer layer and along sidewalls of the polymer layer; the nitride layer over the second magnetic shielding layer and along the sidewalls of the polymer layer; and the oxide layer over the nitride layer and along the sidewalls of the polymer layer. Other aspects include an under-fill layer between the polymer layer and the package substrate. A further aspect includes a SiN spacer along each sidewall of the UBM layer and the Cu pillar; a second epoxy layer adjacent to each SiN spacer; and a second magnetic shielding layer under the second epoxy layer and along sidewalls of the second epoxy layer. Additional aspects include an under-fill layer between the second magnetic shielding layer and the package substrate. Another aspect includes the polymer layer over the second epoxy layer, the nitride layer and portions of the UBM layer and on sidewalls of the UBM layer. Other aspects include the magnetic shielding layer formed to a thickness of 0.1 millimeter (mm) to 0.5 mm. Additional aspects include the magnetic shielding layer including nickel (Ni)-iron (Fe) alloy.

A further aspect of the present disclosure is a device including: a package substrate with BGA-balls; a μ-bump connected to an upper surface of the package substrate; a Cu pillar over the μ-bump; a UBM layer on the Cu pillar; a SiN spacer along each sidewall of the UBM layer and the Cu pillar; an epoxy layer adjacent to each SiN spacer; a magnetic shielding layer under the second epoxy layer and along sidewalls of the second epoxy layer; an under-fill layer between the second magnetic shielding layer and the package substrate; a polymer layer over the epoxy layer, the nitride layer and portions of the UBM layer and on sidewalls of the UBM layer; a passivation stack over the polymer layer; an Al pad over portions of the passivation stack and the UBM layer; a wafer over the passivation stack and the Al pad; a second epoxy layer over the wafer; and a second magnetic shielding layer over the epoxy layer and along sidewalls of the epoxy layer, the wafer, the passivation stack and the polymer layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of interferences or change of spin in a MTJ from stray or externally applied magnetic fields attendant upon forming a magnetic shielding structure over a perpendicular STT-MRAM device. The problem is solved, inter alia, by forming a three dimensional magnetic shielding layer with only μ-bump opening over a perpendicular STT-MRAM structure.

Methodology in accordance with embodiments of the present disclosure includes forming a passivation stack over an upper surface of a wafer and outer portions of an Al pad. A polymer layer is formed over the passivation stack. An UBM layer is formed over the Al pad, portions of the polymer layer and along sidewalls of the polymer layer. A T-shaped Cu pillar is formed over the UBM layer. A μ-bump is formed over the T-shaped Cu pillar. The wafer is diced into a plurality of dies and an epoxy layer is formed over a bottom surface of each die. A magnetic shielding layer is formed over the epoxy layer and along sidewalls of each die, the epoxy layer, the passivation stack and the polymer layer and the μ-bump is connected to a package substrate with BGA-balls.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
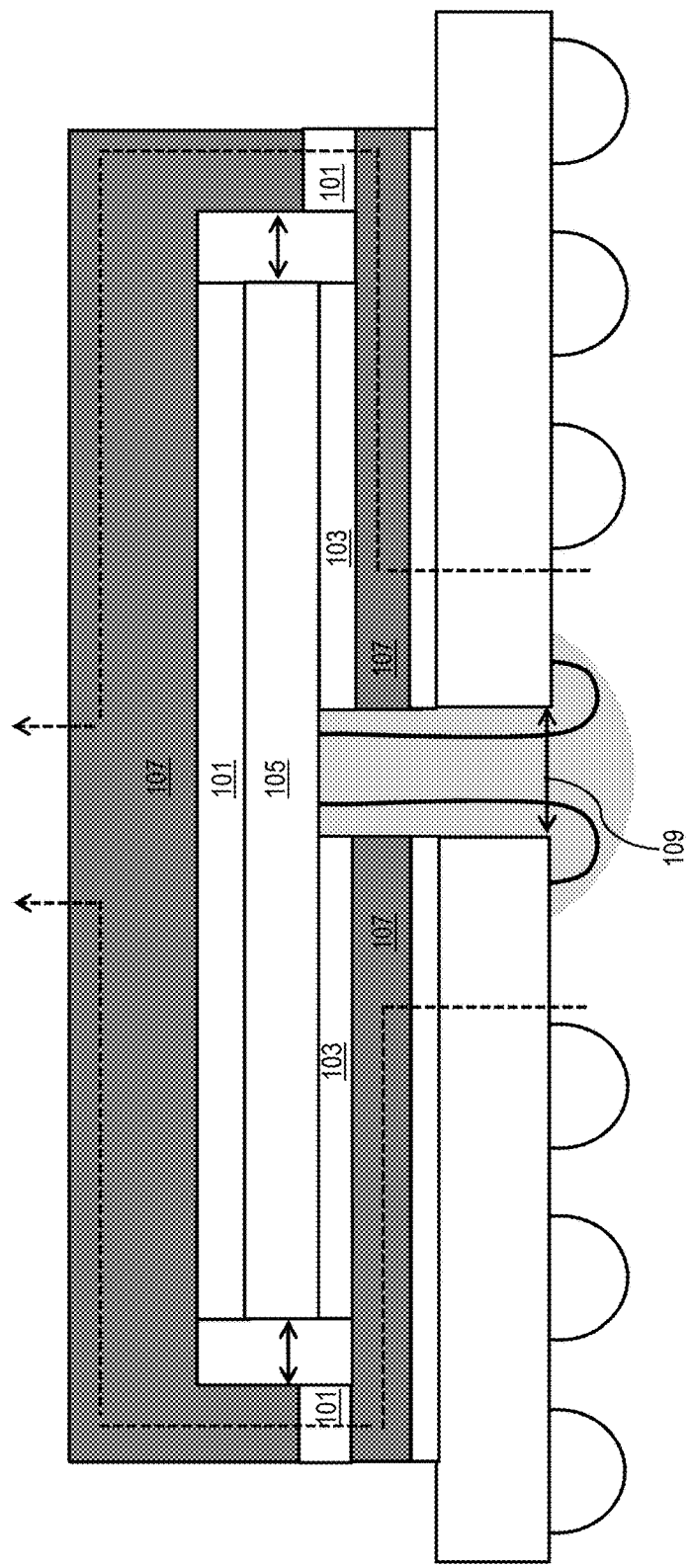
FIG. 1 schematically illustrates a cross-sectional view of a magnetic shielding in a wire-bond MRAM package.
Figure 2:
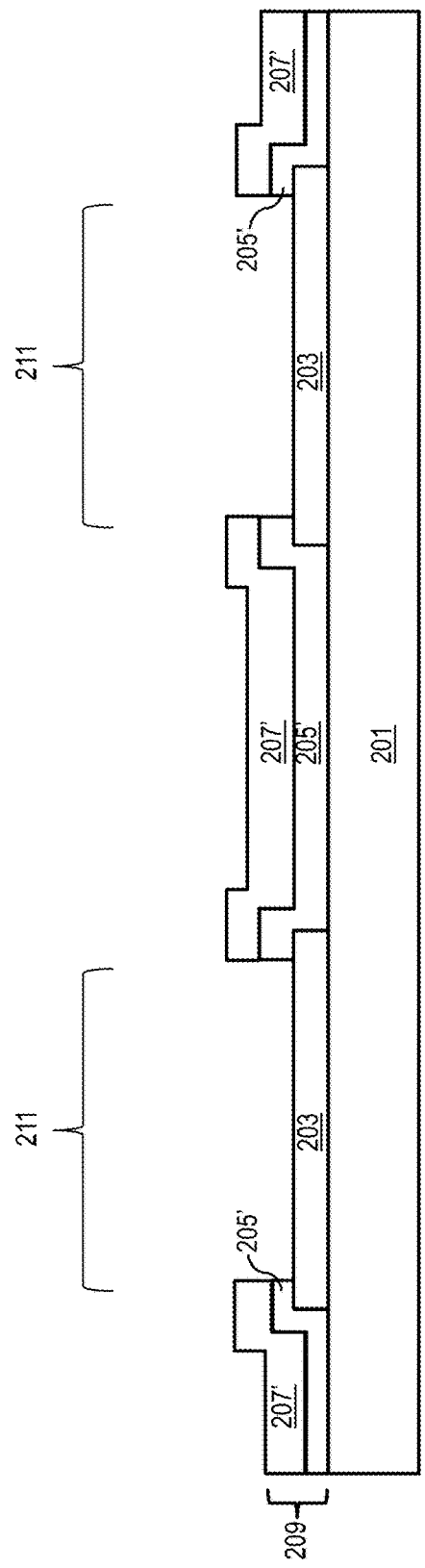
FIGS. 2 through 6 schematically illustrate cross-sectional views of a process flow for package level processing of a magnetic shielding layer, in accordance with an exemplary embodiment.

FIGS. 2 through 6 schematically illustrate cross-sectional views of a process flow for package level processing of a magnetic shielding layer, in accordance with an exemplary embodiment. Referring to FIG. 2, a wafer 201, e.g., a semiconductor wafer or a STT-MRAM wafer, is provided with Al pads 203. An oxide layer 205 is then formed over the wafer 201 and the Al pads 203. Next, a nitride layer 207 is formed over the oxide layer 205. Subsequently, portions of the nitride layer 207 and the oxide layer 205 are patterned down to the Al pads 203, forming the nitride layer 207' and the oxide layer 205' (herein after passivation stack 209), and vias 211.

Figure 3:
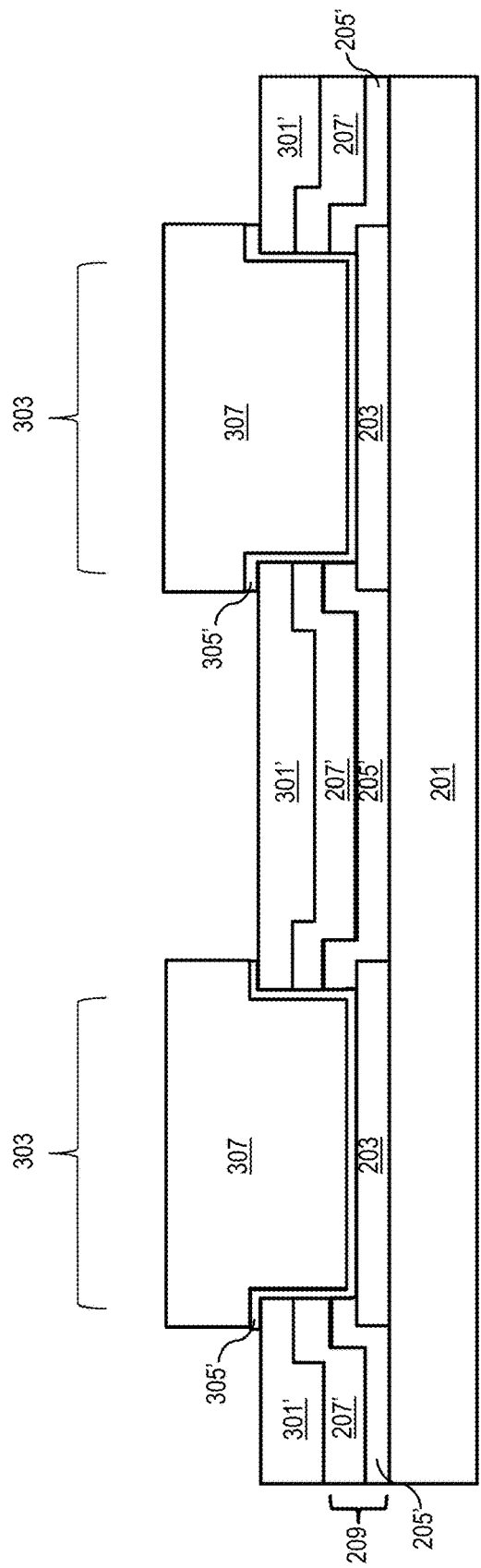

Referring to FIG. 3, a polymer layer 301 (not shown for illustrative convenience) is formed over the passivation stack 209 and the vias 211. Next, portions of the polymer layer 301 are etched by a lithographic process, forming the polymer layer 301' and vias 303. Subsequently, a UBM layer 305 is formed over the polymer layer 301' and the vias 303 and a photoresist layer (not shown for illustrative convenience) is formed over the UBM layer 305 on opposite sides of the Al pads 203. Next, a Cu layer 307 is formed, e.g., by plating, over the UBM layer 305 and along sidewalls of the photoresist layer. Subsequently, the photoresist layer is stripped, forming the T-shaped Cu pillars 307, and portions of the UBM layer 305 are removed, e.g., by wet etch, down to the polymer layer 301', forming the UBM layer 305'.

Figure 4:
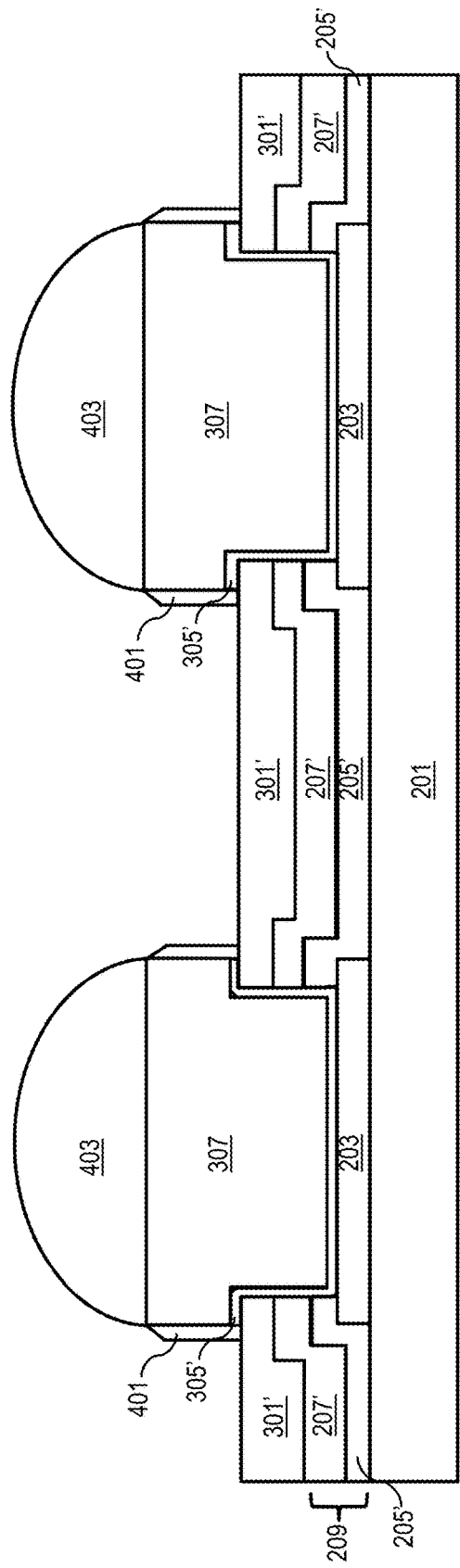

Next, a SiN spacer 401 is formed, e.g., by chemical vapor deposition (CVD) and etch, over portions of the polymer layer 301' along each sidewall of the UBM layer 305' and the T-shaped Cu pillars 307, as depicted in FIG. 4. Then, a μ-bump 403 is formed, e.g., by reflowing a tin (Sn)-silver (Ag) alloy at a temperature of 200° C. to 260° C., over each of the T-shaped Cu pillars 307. The wafer 201 is then diced into a plurality of dies 201'.

Figure 5:
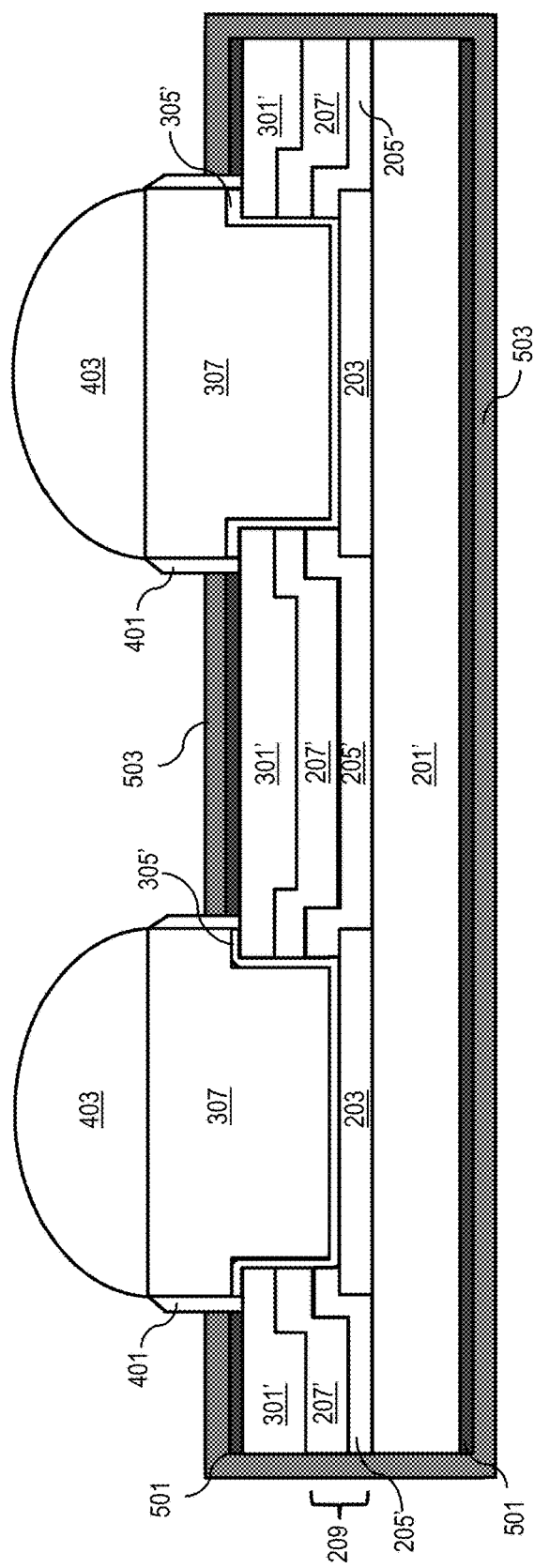

Referring to FIG. 5, an epoxy layer 501 is formed over the top and bottom surface of each die. Subsequently, a magnetic shielding layer 503 is formed mechanically, e.g., of Ni—Fe alloy to a thickness of 0.1 mm to 0.5 mm, over the epoxy layer 501 and along sidewalls of each die 201', the epoxy layer 501, the passivation stack 209 and the polymer layer 301'. In this instance, a small gap is formed between the polymer layer 301', the nitride layer 207', the oxide layer 205, the die 201' and the sidewalls of the magnetic shielding layer 503; however, it is also contemplated that the sidewalls may be adjacent to the various layers as well.

Figure 6:
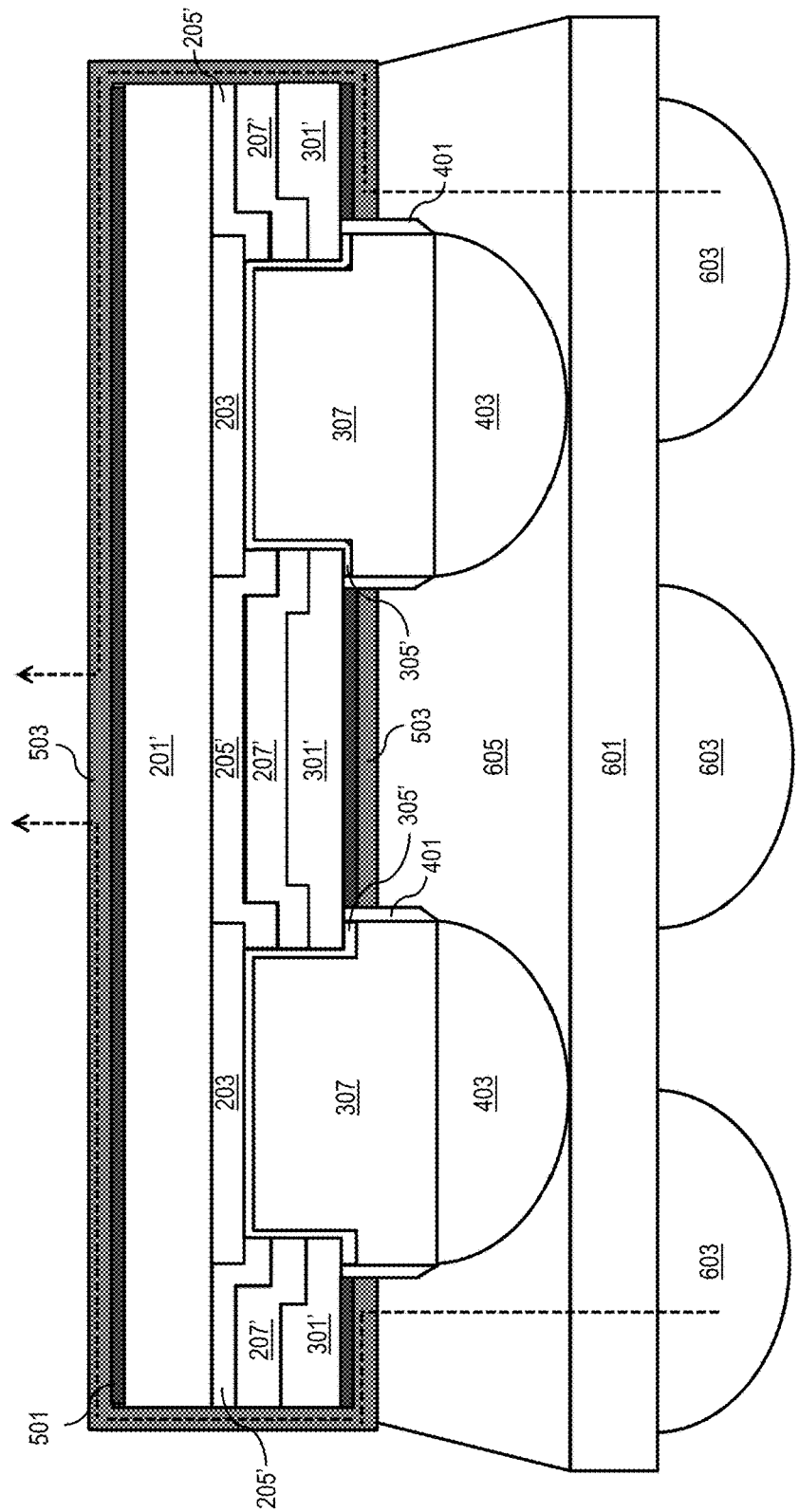

Next, a singular die 201' is flipped and the μ-bumps 403 are connected to a package substrate 601 with BGA-balls 603 by an under-fill layer 605 formed between the magnetic shielding layer 503 and the package substrate 601, as depicted in FIG. 6. Consequently, a flip-chip package with a three-dimensional magnetic shielding layer 503 is formed, thereby protecting the singular die 201' around the KOZ from all directions.

Figure 7:
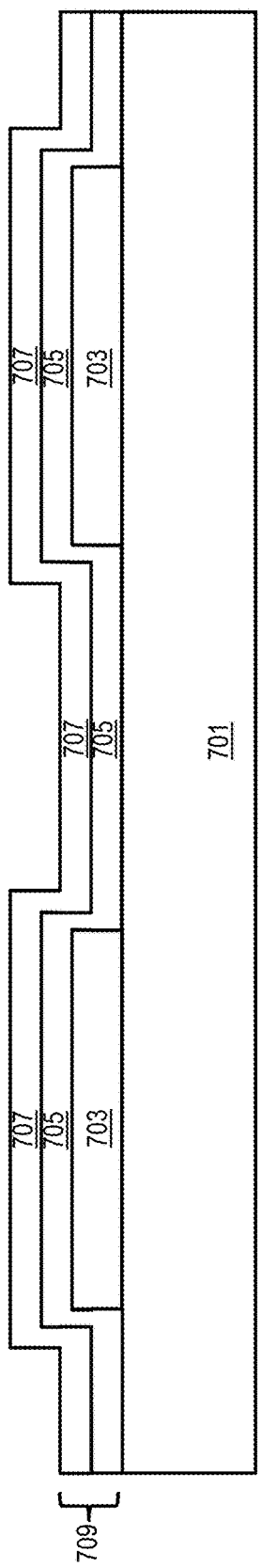
FIGS. 7 through 12 schematically illustrate cross-sectional views of a process flow for wafer level processing of a magnetic shielding layer, in accordance with an exemplary embodiment.
Figure 8:
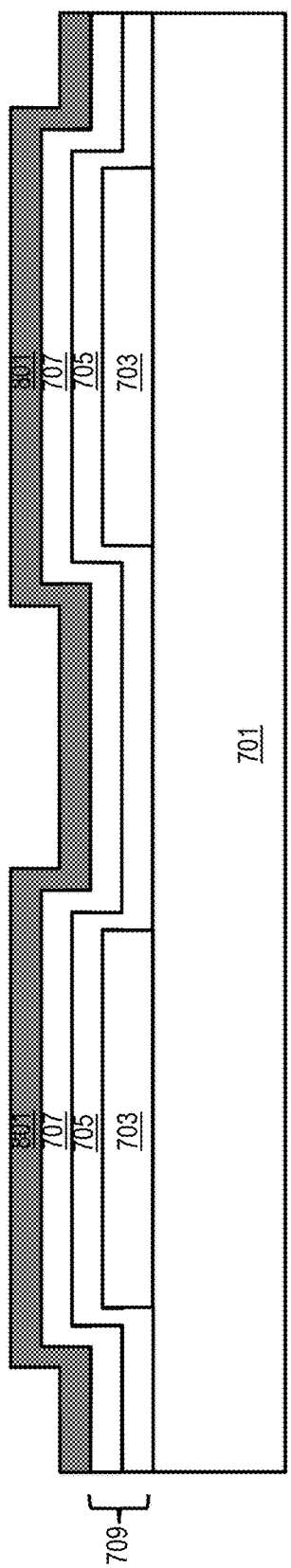
Figure 9:
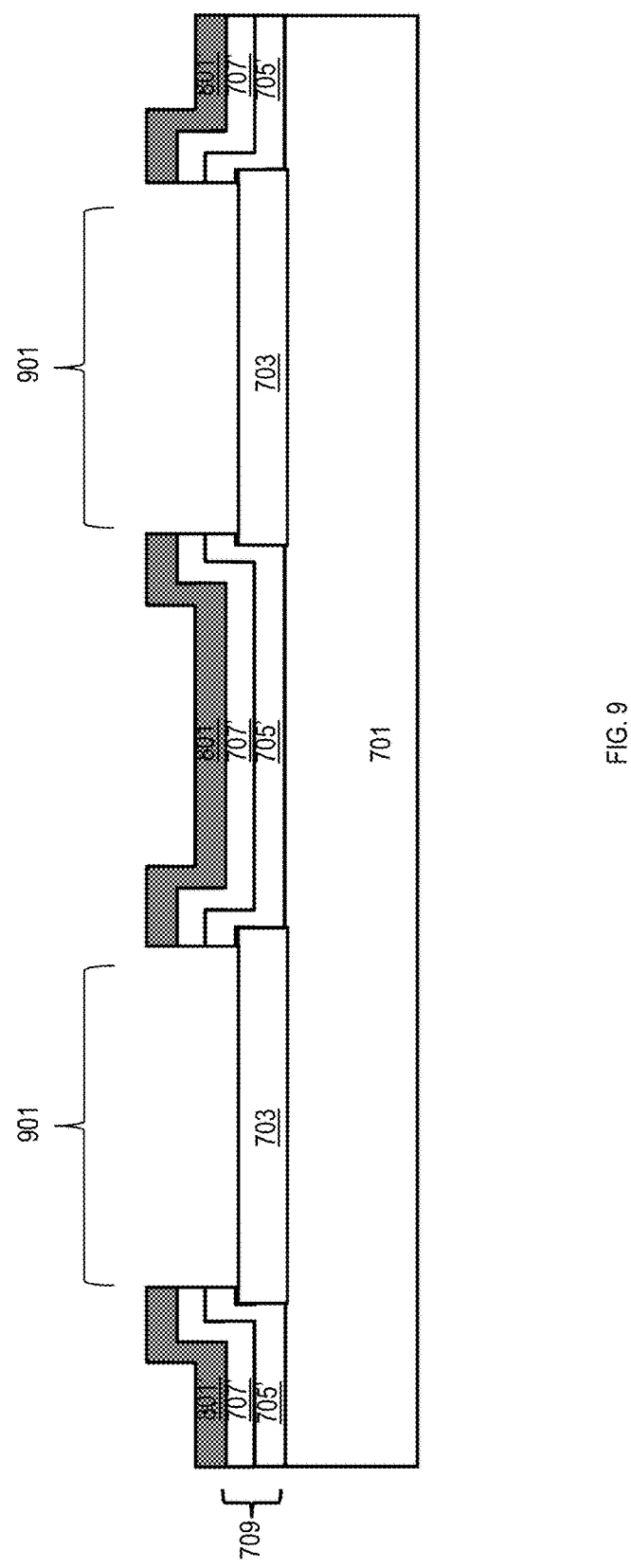

FIGS. 7 through 12 schematically illustrate cross-sectional views of a process flow for wafer level processing of a magnetic shielding layer, in accordance with an exemplary embodiment. Referring to FIG. 7, a wafer 701, e.g., a semiconductor wafer or a STT-MRAM wafer, is provided with Al pads 703. An oxide layer 705 and a nitride layer 707 (herein after passivation stack 709) are then sequentially formed over the wafer 701 and the Al pads 703. Subsequently, a magnetic shielding layer 801 is formed, e.g., of Fe—Ni alloy by physical vapor deposition (PVD) or electrochemical deposition (ECD), over the passivation stack 709, as depicted in FIG. 8. Then, the magnetic shielding layer 801 and the passivation stack 709 are patterned down to the Al pads 703, forming a magnetic shielding layer 801', a nitride layer 707', an oxide layer 705' and vias 901, as illustrated in FIG. 9.

Figure 10:
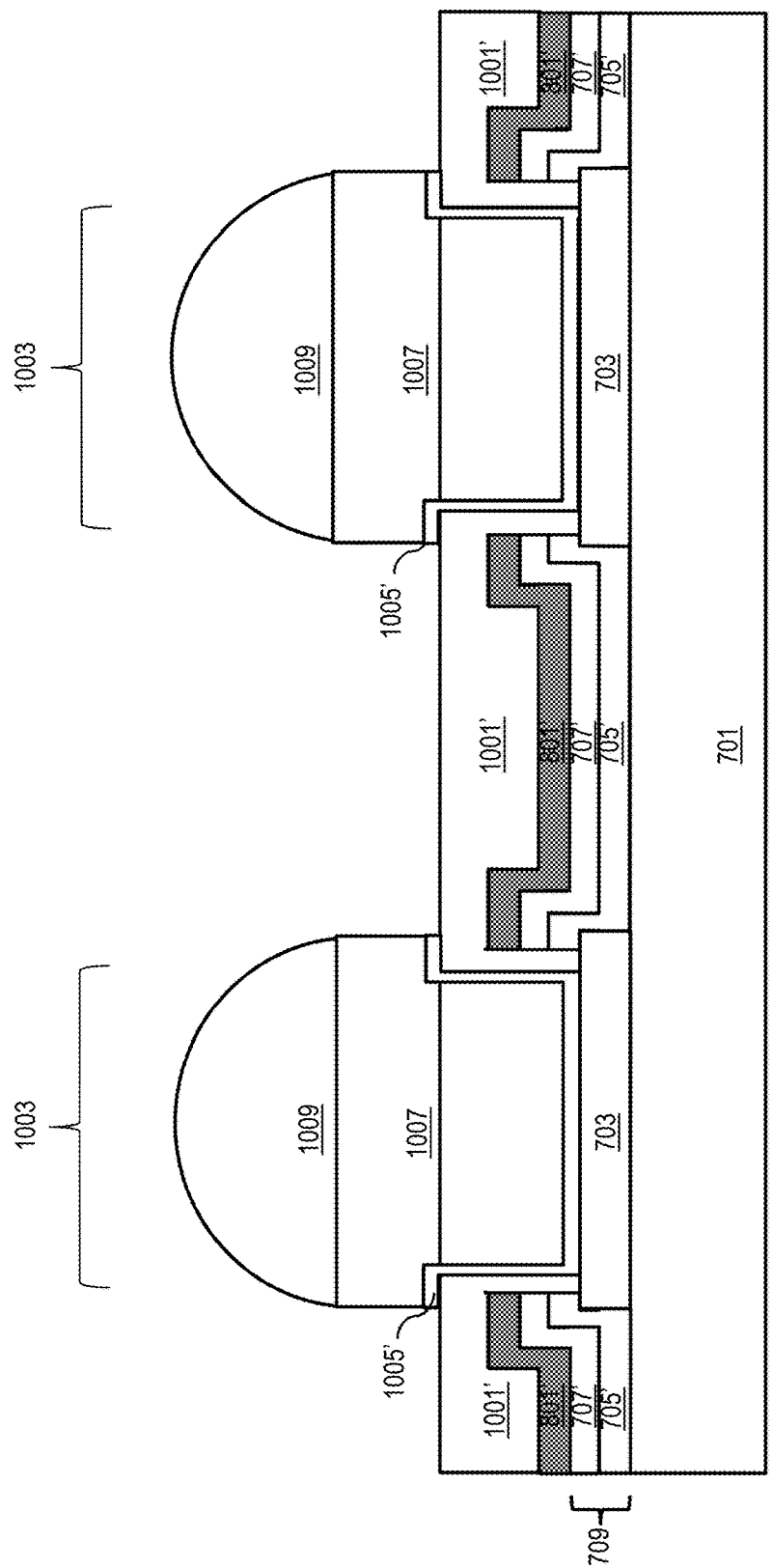

Referring to FIG. 10, a polymer layer 1001 (not shown for illustrative convenience) is formed over the magnetic shielding layer 801' and the vias 901. Then, portions of the polymer layer 1001 are etched by a lithographic process, forming the polymer layer 1001' and vias 1003. Next, a UBM layer 1005 is formed over the polymer layer 1001' and the vias 1003. Then, a photoresist layer (not shown for illustrative convenience) is formed over the UBM layer 1005 on opposite sides of the Al pads 703. Next, a Cu layer 1007 is formed, e.g., by plating, over the UBM layer 1005 and along sidewalls of the photoresist layer. Subsequently, the photoresist layer is stripped, forming T-shaped Cu pillars 1007 and portions of the UBM layer 1005 are removed, e.g., by wet etch, forming a UBM layer 1005'. Thereafter, a μ-bump 1009 is formed, e.g., by reflowing a Sn—Ag alloy at a temperature of 200° C. to 260° C., over each of the T-shaped Cu pillars 1007.

Figure 11:
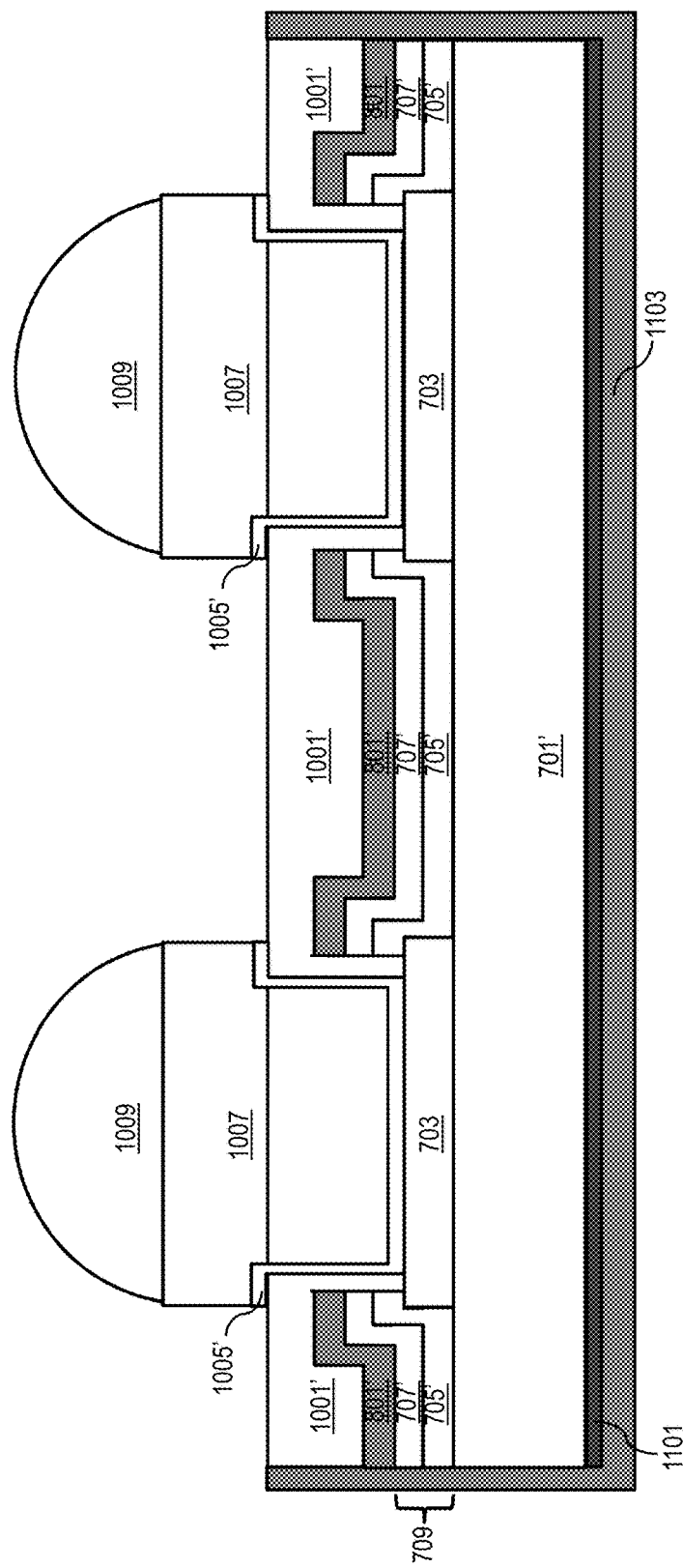
Figure 12:
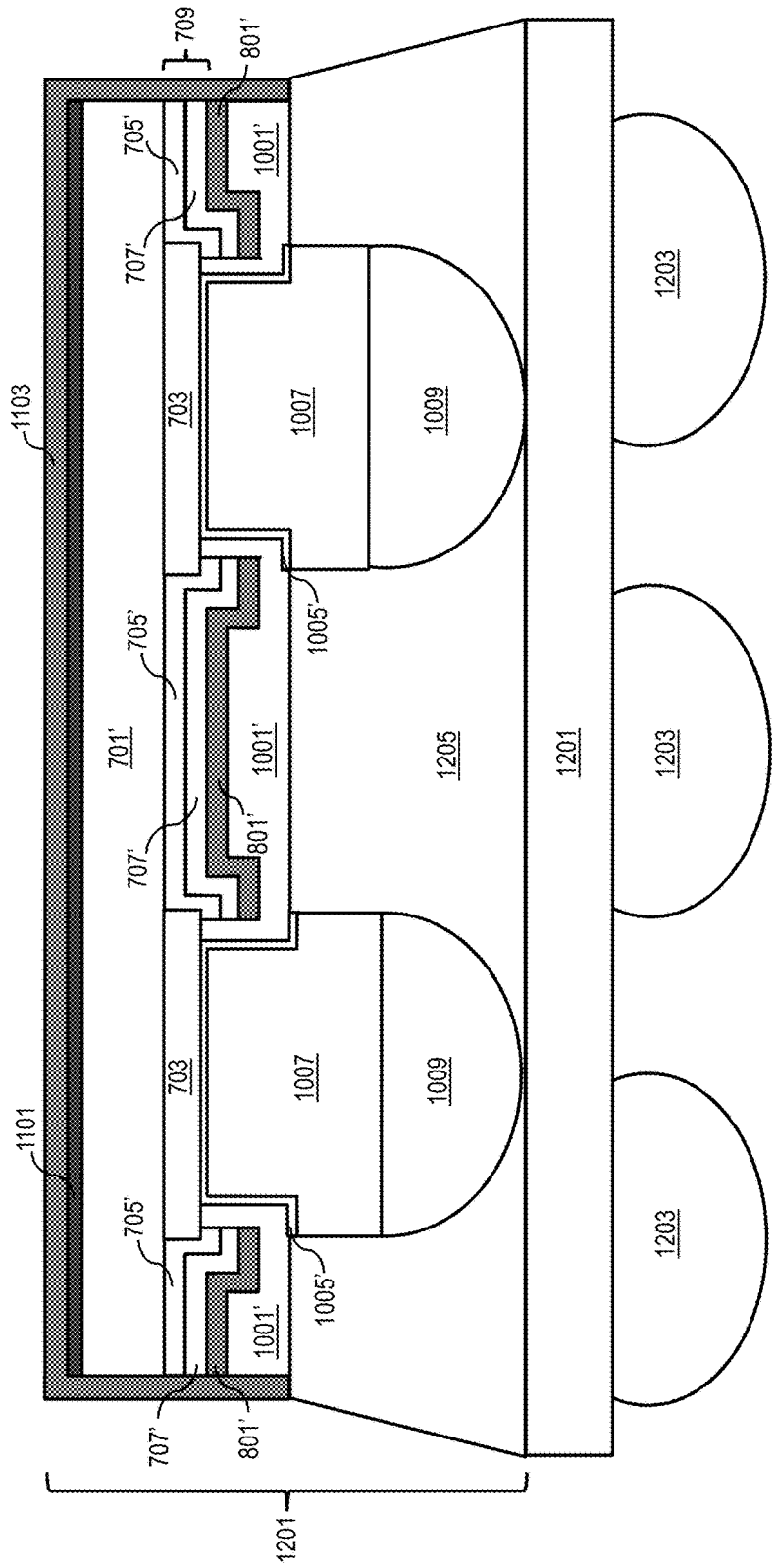

Next, the wafer 701 is diced into a plurality of dies 701' and an epoxy layer 1101 is formed over the bottom surface of each die 701', as depicted in FIG. 11. Subsequently, a magnetic shielding layer 1103 is formed, e.g., of Ni—Fe alloy to a thickness of 0.1 mm to 0.5 mm, over the epoxy layer 1101 and along sidewalls of each die 701', the epoxy layer 1101, the passivation stack 709 and the polymer layer 1001'. As illustrated in FIG. 12, the plurality of dies 701' are flipped, and the μ-bumps 1009 are connected to a package substrate 1201 with BGA-balls 1203 by an under-fill layer 1205 formed between the polymer layer 1001' and the package substrate 1201. Again, a flip-chip package with three-dimensional magnetic shielding layers 801' and 1103 is formed, thereby protecting the plurality of dies 701' around the KOZ from all directions.

Figure 13:
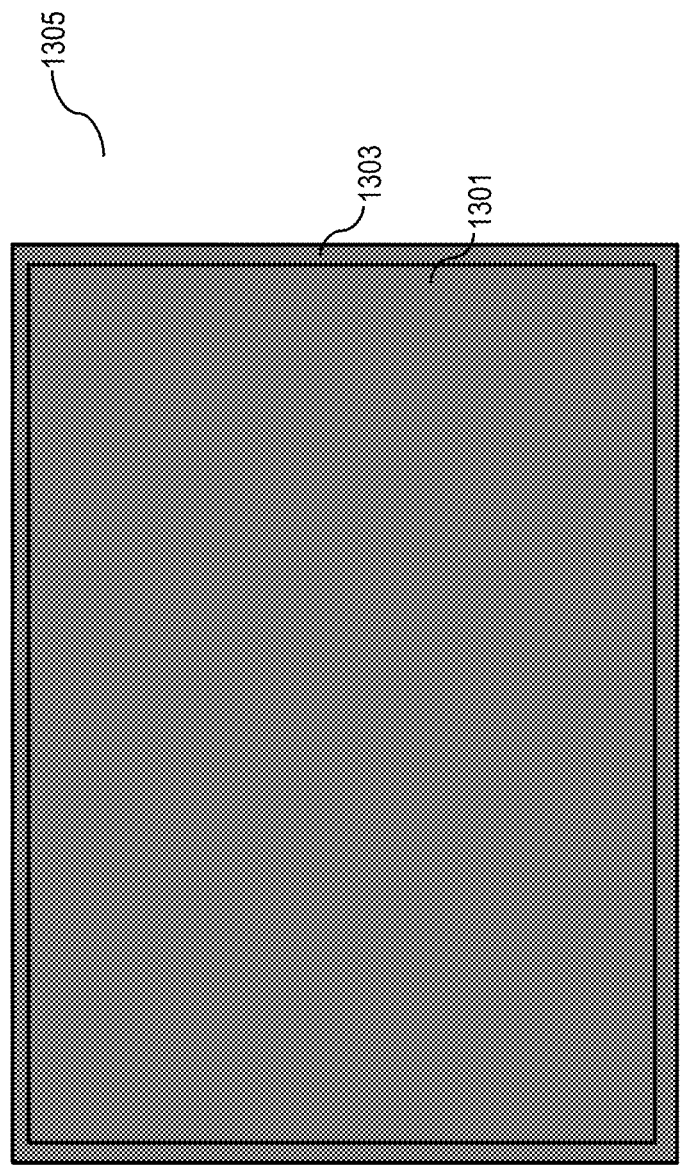
FIG. 13 is a top view of the upper portion and sidewalls of a three-dimensional magnetic shielding layer for a flip-chip package, in accordance with an exemplary embodiment.
Figure 14:
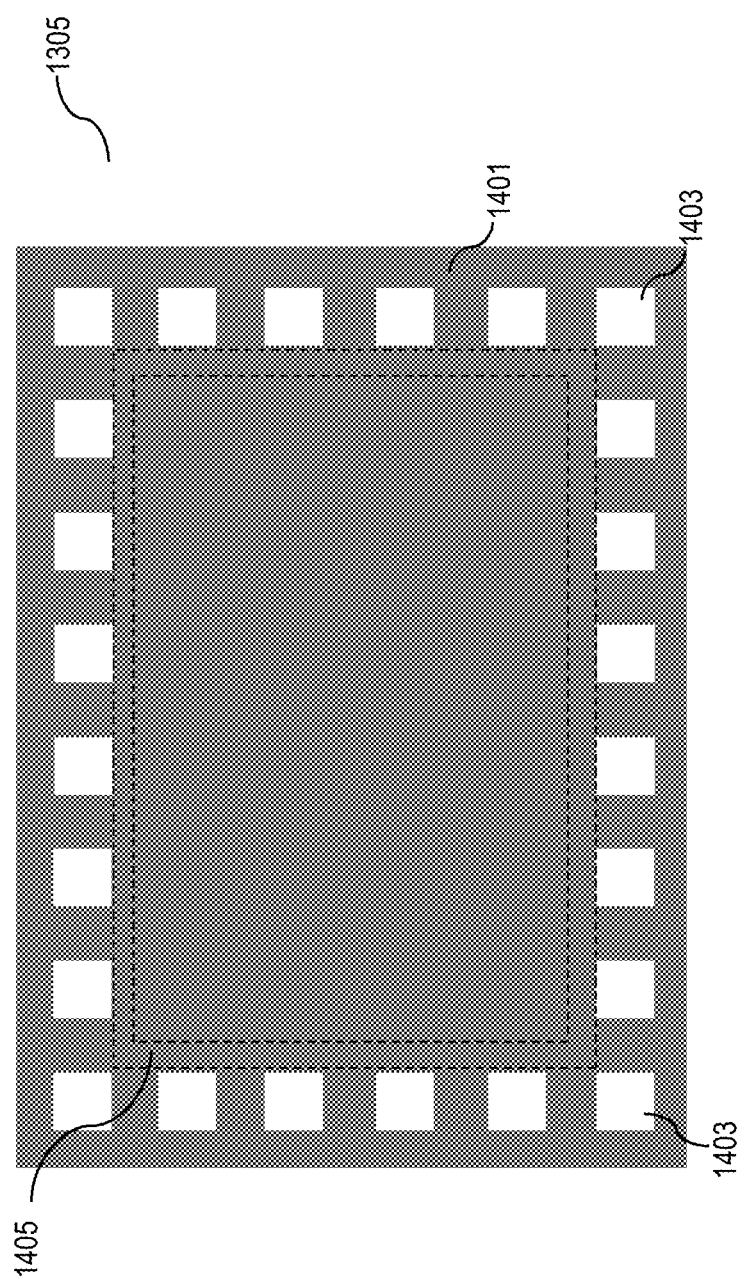
FIG. 14 is a top view of the bottom portion of a three-dimensional magnetic shielding layer with openings around the KOZ for μ-bumps, in accordance with an exemplary embodiment.

FIGS. 13 and 14 are top views of the upper and bottom portions of a three-dimensional magnetic shielding layer for a flip-chip package, in accordance with an exemplary embodiment. Referring to FIGS. 13 and 14, the upper portion 1301 and the sidewalls 1303 of the three-dimensional magnetic shielding layer 1305 encapsulate the plurality of dies from five of the six sides and the bottom portion 1401 with openings 1403 around the KOZ 1405 for μ-bumps encapsulates the plurality of dies from the remaining sixth side, thereby reducing the area exposed and improving the magnetic shielding efficiency of the resultant device.

Figure 15:
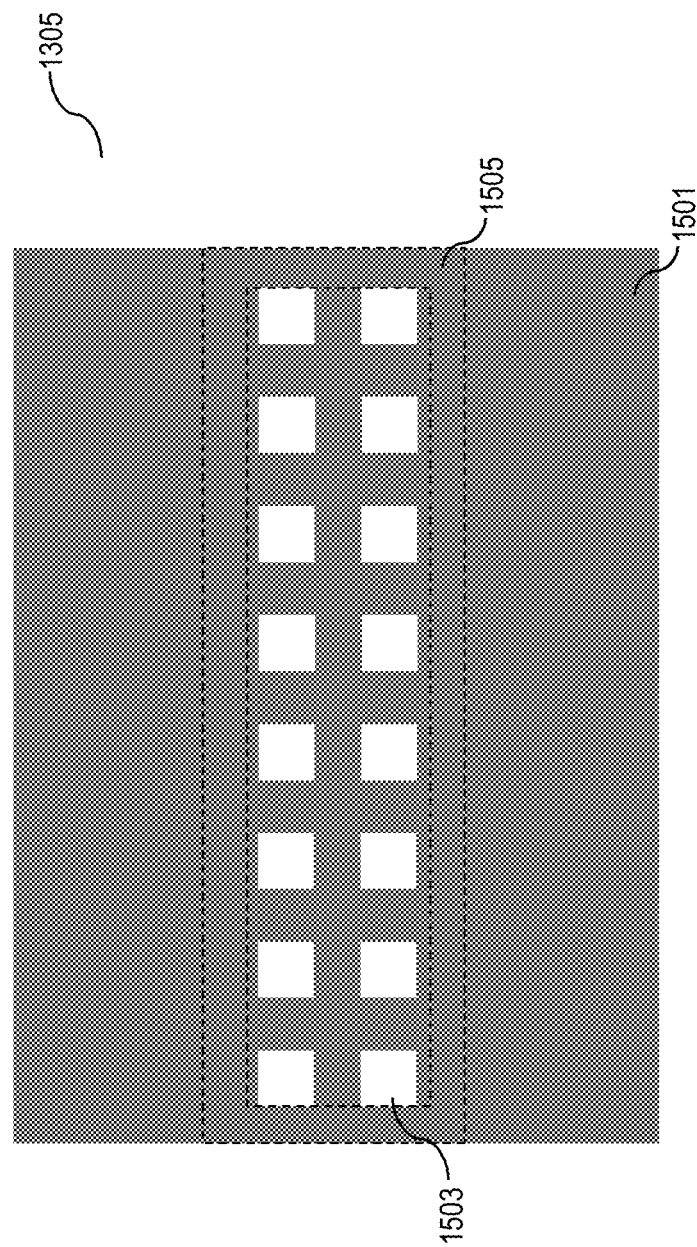
FIGS. 15 and 16 are top views of bottom portions of a three-dimensional magnetic shielding layer for a flip-chip package, in accordance with an exemplary embodiment.
Figure 16:
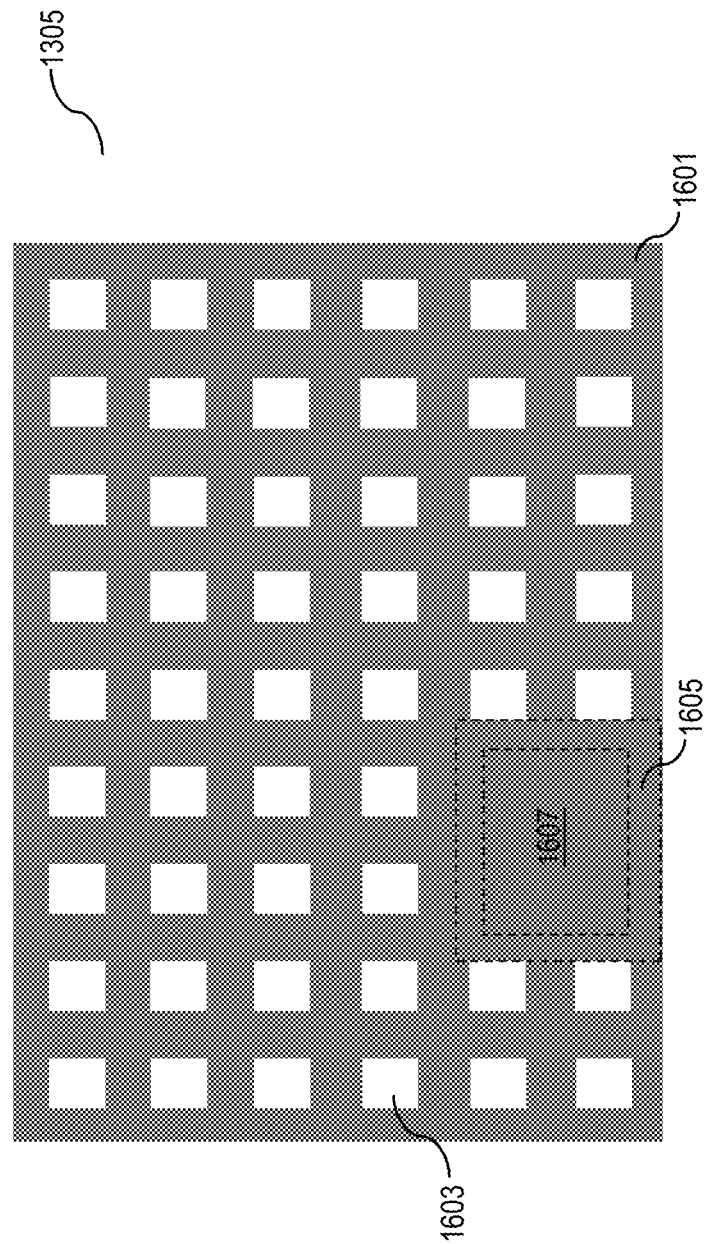

FIGS. 15 and 16 are top views of bottom portions of a three-dimensional magnetic shielding layer for a flip-chip package, in accordance with an exemplary embodiment. Referring to FIG. 15, the bottom portion 1501 of the magnetic shielding layer 1305 has openings 1503 within the KOZ 1505 for μ-bumps, thereby reducing the area exposed and improving the magnetic shielding efficiency. FIG. 16 is another configuration of the bottom shield for a dense I/O SOC. The bottom portion 1601 of the magnetic shielding layer 1305 has openings 1603 around the KOZ 1605 to ensure there is no opening in the MRAM block 1607, thereby protecting the MRAM block from any externally applied electromagnetic fields.

The embodiments of the present disclosure can achieve several technical effects, such as higher shielding efficiency, and smaller openings in the protective metal layers resulting in an improved level of magnetic immunity. In addition, the present method is cost effective because the protective metal layers are formed at package level. Further, there is an ease in fabrication since the protective metal layers are prefabricated. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including STT-MRAMs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a passivation stack over an upper surface of a wafer and outer portions of an aluminum (Al) pad;
forming a polymer layer over the passivation stack;
forming an under bump metallization (UBM) layer over the Al pad, portions of the polymer layer and along sidewalls of the polymer layer;
forming a T-shaped copper (Cu) pillar over the UBM layer;
forming a micro bump (µ-bump) over the T-shaped Cu pillar;
dicing the wafer into a plurality of dies;
forming an epoxy layer over a bottom surface of each die;
forming a magnetic shielding layer over the epoxy layer and along sidewalls of each die, the epoxy layer, the passivation stack and the polymer layer;
connecting the µ-bump to a package substrate with a ball grid array (BGA)-balls;
forming a second magnetic shielding layer over the passivation stack prior to forming the polymer layer; and
forming the polymer layer over the second magnetic shielding layer and portions of the Al pad and along sidewalls of the second magnetic shielding layer and the passivation stack.

2. The method according to claim 1, comprising forming the passivation stack by:
forming an oxide layer over the wafer and the Al pad;
forming a nitride layer over the oxide layer; and
forming a via through patterning the nitride layer and the oxide layer down to the Al pad.

3. The method according to claim 1, comprising forming the UBM layer and the T-shaped Cu pillar by:
forming a UBM layer over the polymer layer and the Al pad and along sidewalls of the polymer layer;
forming a photoresist layer over the UBM layer on opposite sides of the Al pad;
forming a Cu layer over the UBM layer and along sidewalls of the photoresist layer;
stripping the photoresist layer; and
removing exposed portions of the UBM layer down to the polymer layer.

4. The method according to claim 1, comprising connecting the µ-bump to a package substrate by:
forming an under-fill layer between the polymer layer and the package substrate.

5. The method according to claim 1, further comprising forming the UBM layer along sidewalls of the passivation stack.

6. The method according to claim 1, comprising forming the µ-bump by:
forming a metal layer over the T-shaped Cu pillar; and
reflowing the metal layer at a temperature of 200° C. to 260° C.

7. The method according to claim 1, further comprising:
forming a silicon nitride (SiN) spacer over portions of the polymer layer along each sidewall of the UBM layer and the T-shaped Cu pillar prior to forming magnetic shielding layer;
forming a second epoxy layer over the polymer layer and adjacent to each SiN spacer; and
forming a second magnetic shielding layer over the second epoxy layer and along sidewalls of the second epoxy layer.

8. The method according to claim 7, comprising connecting the µ-bump to a package substrate by:
forming an under-fill layer between the second magnetic shielding layer and the package substrate.

9. The method according to claim 1, further comprising:
patterning the magnetic shielding layer over the front surface of the wafer around a keep out zone (KOZ) for µ-bumps.

10. A device comprising:
a package substrate with a ball grid array (BGA)-balls;
a micro bump (µ-bump) connected to an upper surface of the package substrate;
a copper (Cu) pillar over the µ-bump;
an under bump metallization (UBM) layer on the Cu pillar;
a polymer layer over portions of the UBM layer and on sidewalls of the UBM layer;
a passivation stack over the polymer layer;
an aluminum (Al) pad over portions of the passivation stack and the UBM layer;
a wafer over the passivation stack and the Al pad;
an epoxy layer over the wafer;
a magnetic shielding layer over the epoxy layer and along sidewalls of the epoxy layer, the wafer, the passivation stack and the polymer layer;
a second magnetic shielding layer over the polymer layer and along sidewalls of the polymer layer;
the nitride layer over the second magnetic shielding layer and along the sidewalls of the polymer layer; and
the oxide layer over the nitride layer and along the sidewalls of the polymer layer.

11. The device according to claim 10, wherein the passivation stack comprises:
a nitride layer over the polymer layer; and
an oxide layer over the nitride layer.

12. The device according to claim 10, further comprising:
an under-fill layer between the polymer layer and the package substrate.

13. The device according to claim 10, further comprising:
a silicon nitride (SiN) spacer along each sidewall of the UBM layer and the Cu pillar;
a second epoxy layer adjacent to each SiN spacer; and
a second magnetic shielding layer under the second epoxy layer and along sidewalls of the second epoxy layer.

14. The device according to claim 13, comprising:
an under-fill layer between the second magnetic shielding layer and the package substrate.

15. The device according to claim 13, comprising:
the polymer layer over the second epoxy layer, the nitride layer and portions of the UBM layer and on sidewalls of the UBM layer.

16. The device according to claim 10, wherein the magnetic shielding layer is formed to a thickness of 0.1 millimeter (mm) to 0.5 mm.

17. The device according to claim 10, wherein the magnetic shielding layer comprises nickel (Ni)-iron (Fe) alloy.

18. A device comprising:
a package substrate with a ball grid array (BGA)-balls;
a micro bump (µ-bump) connected to an upper surface of the package substrate;
a copper (Cu) pillar over the µ-bump;
an under bump metallization (UBM) layer on the Cu pillar;
a silicon nitride (SiN) spacer along each sidewall of the UBM layer and the Cu pillar;
an epoxy layer adjacent to each SiN spacer;

a magnetic shielding layer under a second epoxy layer and along sidewalls of the second epoxy layer;
an under-fill layer between a second magnetic shielding layer and the package substrate;
a polymer layer over the epoxy layer, the nitride layer and portions of the UBM layer and on sidewalls of the UBM layer;
a passivation stack over the polymer layer;
an aluminum (Al) pad over portions of the passivation stack and the UBM layer; and
a wafer over the passivation stack and the Al pad,
wherein the second epoxy layer is formed over the wafer, and
the second magnetic shielding layer is formed over the epoxy layer and along sidewalls of the epoxy layer, the wafer, the passivation stack and the polymer layer.

* * * * *